United States Patent
Ichikawa

(10) Patent No.: US 9,430,340 B2
(45) Date of Patent: Aug. 30, 2016

(54) INFORMATION PROCESSING DEVICE AND SEMICONDUCTOR DEVICE

(71) Applicant: LAPIS Semiconductor Co., Ltd., Yokohama (JP)

(72) Inventor: Takeshi Ichikawa, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 138 days.

(21) Appl. No.: 14/320,445

(22) Filed: Jun. 30, 2014

(65) Prior Publication Data
US 2015/0006942 A1 Jan. 1, 2015

(30) Foreign Application Priority Data
Jul. 1, 2013 (JP) .................................. 2013-137959

(51) Int. Cl.
| | | |
|---|---|---|
| G11C 29/00 | (2006.01) | |
| G06F 11/16 | (2006.01) | |
| G06F 11/22 | (2006.01) | |
| G11C 16/34 | (2006.01) | |

(52) U.S. Cl.
CPC ......... G06F 11/167 (2013.01); G06F 11/2221 (2013.01); *G11C 16/3436* (2013.01)

(58) Field of Classification Search
CPC combination set(s) only.
See application file for complete search history.

(56) References Cited

U.S. PATENT DOCUMENTS

| | | | | |
|---|---|---|---|---|
| 3,544,777 A * | 12/1970 | Winkler | ................ | G06F 11/167 |
| | | | | 365/130 |
| 5,619,642 A * | 4/1997 | Nielson | ............... | G06F 11/1076 |
| | | | | 714/42 |
| 6,052,803 A * | 4/2000 | Bhatia | .................. | G06F 11/167 |
| | | | | 714/49 |
| 6,910,178 B1 * | 6/2005 | Kiselev | ............. | G11B 20/1803 |
| | | | | 714/797 |
| 8,140,921 B2 * | 3/2012 | Matsuoka | ................. | B66B 1/34 |
| | | | | 710/114 |
| 9,152,511 B2 * | 10/2015 | Rohleder | ............ | G06F 11/1666 |
| 2013/0114340 A1 * | 5/2013 | Tailliet | .................... | G06F 11/20 |
| | | | | 365/185.11 |
| 2013/0151767 A1 * | 6/2013 | Berke | ................. | G06F 11/1048 |
| | | | | 711/105 |
| 2015/0040226 A1 * | 2/2015 | Barau | .................. | G06F 11/167 |
| | | | | 726/23 |

FOREIGN PATENT DOCUMENTS

JP   2002-063044 A   2/2002

* cited by examiner

*Primary Examiner* — Guerrier Merant
(74) *Attorney, Agent, or Firm* — Rabin & Berdo, P.C.

(57) ABSTRACT

A verification control part has the same write information data piece written into each of a plurality of memories according to a write instruction and then reads out information data piece from the plurality of memories. At this time, a coincidence determining part performs first verification to determine whether respective read-out information data pieces read out from the memories coincide with each other and outputs a verification result signal to the outside, and simultaneously the verification control part outputs one of the read-out information data pieces as an information data piece for second verification, which performs coincidence determination with the write information data piece, to the outside.

4 Claims, 4 Drawing Sheets

INFORMATION PROCESSING DEVICE AND SEMICONDUCTOR DEVICE

BACKGROUND OF THE INVENTION

1. Field of the Invention

The present invention relates to an information processing device, particularly an information processing device comprising memories to write information data into and a semiconductor device in which the information processing device is formed.

2. Description of the Related Art

As wattmeters to measure the usage amount of power used in facilities receiving power supply from an electric power company, there have been known smart meters, which comprise a communication function to notify the measured power usage amount to the power supply company. In the smart meter, a CPU (Central Processing Part) and a program memory storing a program are incorporated to perform this communication through microcomputer control. As the program memory, a non-volatile memory such as a flash memory is used to allow for version upgrade of program data. However, if a power failure or the like occurs while new program data is being written into the memory in the program version-upgrade process, then the program data written is destroyed with the possibility that the smart meter may become unable to operate.

Accordingly, a program rewriting method has been proposed wherein the same program data is stored in two memory areas in the memory, wherein at version upgrade, new program data is over-written into one memory area, and wherein when the new program data is verified to be correctly written, this program data is copied into the other memory area (refer to, e.g., Japanese Patent Publication No. 2002-63044). According to this program rewriting method, even if the new program data over-written into the one memory area is destroyed because of a power failure or the like at version upgrade, by executing the old program data stored in the other memory area, the state of being unable to operate can be avoided.

In this program rewriting method, determination of whether program data has been correctly written is performed through error detection using a checksum, and hence the reliability of the determination is low.

Accordingly, it is conceivable that at the time of writing in the initial version of program data before product shipment, which requires high reliability, so-called verification will be performed where after writing the same program data into each memory area, program data is read out from each memory area, and where it is determined whether the read-out program data is the same as the above write program data.

However, there is the problem that if this verification is performed sequentially for the two memory areas, a very long time will be spent.

SUMMARY OF THE INVENTION

An object of the present invention is to provide an information processing device which can write information data into memories at high speed and with high reliability and a semiconductor device in which the information processing device is formed.

According to the present invention, there is provided an information processing device which includes a plurality of memories, and the information processing device comprises a verification control part that controls the plurality of memories to write the same write information data piece into each of the plurality of memories according to a write instruction and then to read out information data pieces from the plurality of memories; and a coincidence determining part that performs first verification to determine whether or not respective read-out information data pieces read out from the memories by the verification control part coincide with each other and outputs a verification result signal indicating the determination result to the outside, wherein the verification control part is configured to output one of the read-out information data pieces as an information data piece for second verification, which performs coincidence determination with the write information data piece, to the outside.

According to the present invention, there is provided a semiconductor device in which a plurality of memories are formed, and the semiconductor device comprises a verification control part that controls the plurality of memories to write the same write information data piece into each of the plurality of memories according to a write instruction and then to read out information data pieces from the plurality of memories; and a coincidence determining part that performs first verification to determine whether or not respective read-out information data pieces read out from the memories by the verification control part coincide with each other and outputs a verification result signal indicating the determination result to the outside, wherein the verification control part is configured to output one of the read-out information data pieces as an information data piece for second verification, which performs coincidence determination with the write information data piece, to the outside.

Further, according to the present invention, there is provided a semiconductor device which includes a plurality of memories, and the semiconductor device comprises a first receive part that receives first write data via a first interface; a second receive part that receives second write data via a second interface; and a control part that reads out data stored in one memory of the plurality of memories and performs control operation according to the data. When the first receive part receives the first write data, the control part writes the first write data into a memory other than the one memory from which the data was read out, and when receiving the second write data, the second receive part instructs the control part to enable parallel writing into the plurality of memories and to stop operating and performs parallel writing of the second write data into the plurality of memories.

DETAILED DESCRIPTION OF THE PREFERRED EMBODIMENT

An embodiment of the present invention will be described in detail below with reference to the drawings.

Figure 1:
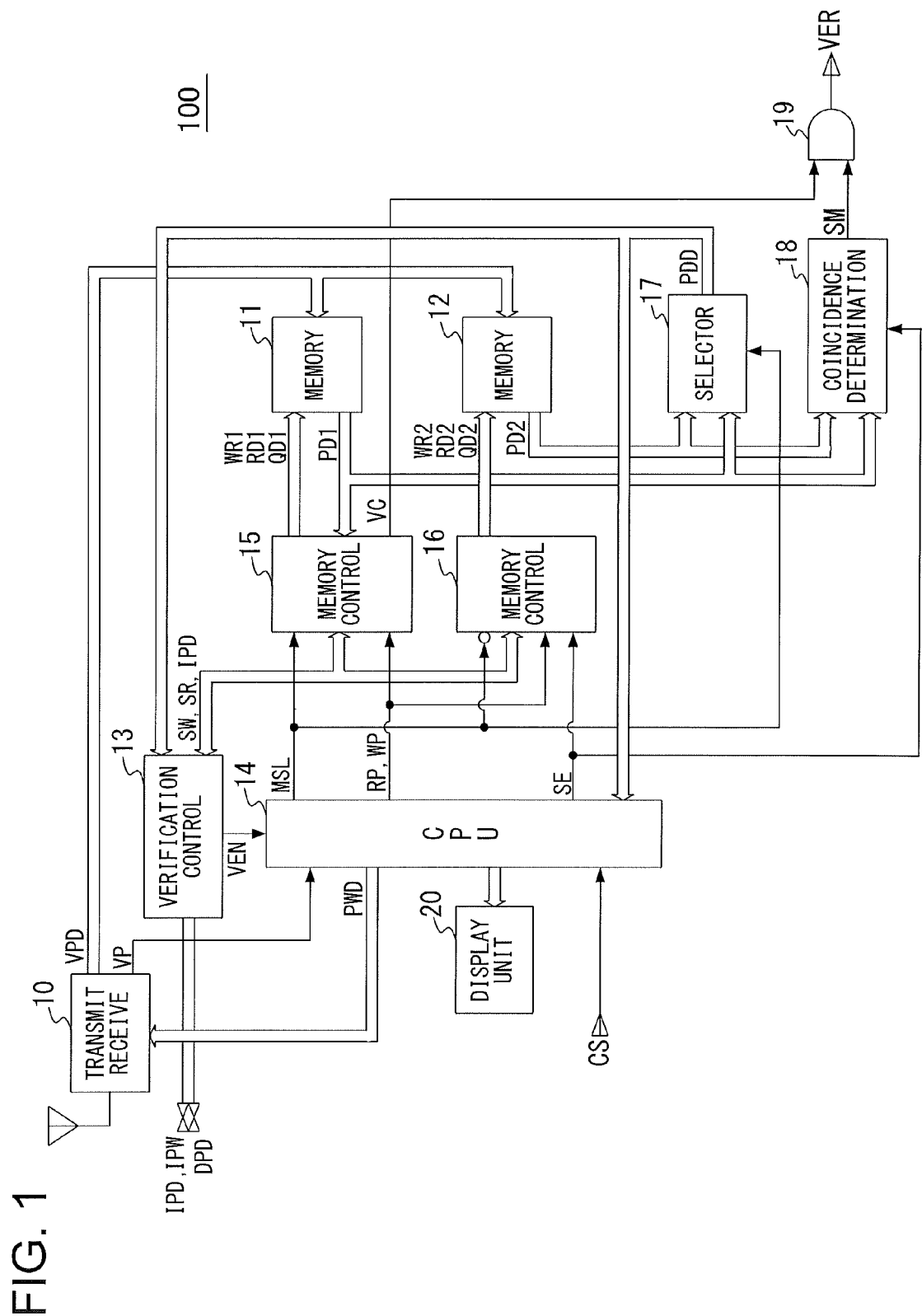
FIG. 1 is a block diagram showing the configuration of a smart meter 100 as an information processing device according to the present invention.

FIG. 1 is a block diagram showing the configuration of a smart meter 100 as an information processing device according to the present invention. The smart meter 100 is installed in a facility receiving power supply from an electric power company. The smart meter 100 adds up the amounts of electric power used in the facility based on the amounts of current detected by a current sensor (not shown) provided in the distribution switchboard (not shown) of the facility to notify the power usage amount to the electric power company (a communication mode). Further, the smart meter 100 performs electric power management control such as displaying to monitor the amount of electric power used in the facility, reception control of electric power from small-scale power generation facilities (e.g., a solar power generation panel and a wind power generator), or charge-discharge control for the battery of an electric car (an electric power management mode).

As shown in FIG. 1, the smart meter 100 includes a transmit-receive part 10, memories 11 and 12, a verification control part 13, a CPU (Central Processing Unit) 14, memory control parts 15 and 16, a selector 17, a coincidence determining part 18, an AND gate 19, and a display unit 20. These modules (10 to 19) are formed on a single semiconductor chip or distributed over multiple semiconductor chips.

In FIG. 1, the transmit-receive part 10 receives a signal transmitted from the electric power company and performs demodulation on the transmitted signal. When having obtained program data for version upgrade and a version upgrade instruction signal through this demodulation, the transmit-receive part 10, according to the version upgrade instruction signal, supplies the program data for version upgrade as program data VPD to the memories 11 and 12 and simultaneously a version upgrade instruction signal VP to the CPU 14. When power usage amount data PWD denoting the power usage amount is supplied from the CPU 14, the transmit-receive part 10 modulates the power usage amount data PWD and transmits the resultant modulated power usage amount signal to the electric power company. The transmit-receive part 10 performs transmission to and reception from the electric power company as described above by radio communication via an antenna or wire communication via the Internet network or the like.

The memories 11 and 12 are constituted by data rewritable ones, e.g., non-volatile flash memories. The memories 11 and 12 each store a program to be executed by the CPU 14, that is, program data representing a program for realizing the communication mode and the electric power management mode (described later). The memories 11 and 12 store the same program data.

The memory 11, according to a write signal WR1 supplied from the memory control part 15, writes the program data VPD for version upgrade supplied from the transmit-receive part 10 or the initial version of program data QD1 supplied from the memory control part 15 into itself. The memory 11, according to a read signal RD1 supplied from the memory control part 15, reads out program data (VPD, QD1) stored in itself and supplies this as program data PD1 for execution to the memory control part 15, the selector 17, and the coincidence determining part 18.

The memory 12, according to a write signal WR2 supplied from the memory control part 16, writes the program data VPD for version upgrade or the initial version of program data QD2 supplied from the memory control part 16 into itself. The memory 12, according to a read signal RD2 supplied from the memory control part 16, reads out program data (VPD, QD2) stored in itself and supplies this as program data PD2 to the selector 17 and the coincidence determining part 18.

When a program write instruction signal IPW and initial program data IPD representing the initial version of a program are supplied via input/output external terminals, the verification control part 13, according to this program write instruction signal IPW, performs the following memory write verification process. In the memory write verification process, the verification control part 13 supplies a verification enable signal VEN to enable memory write verification to the CPU 14 and simultaneously a program write signal SW and the initial program data IPD to the memory control parts 15 and 16. In the memory write verification process, the verification control part 13 supplies a verification read signal SR to the memory control parts 15 and 16. In the memory write verification process, when read-out program data PDD is supplied via the selector 17, the verification control part 13 outputs this read-out program data PDD as read-out program data DPD for verification via the input/output external terminals for verification. The sequence in the memory write verification process will be described in detail later.

The CPU 14, in response to power-on, takes in program execution memory information stored in an internal register (not shown). The CPU 14 selects a memory (11 or 12) designated by the program execution memory information and supplies a memory selection signal MSL to set this to be in an enabled state to the selector 17 and the memory control parts 15 and 16. For example, at the initial state, program execution memory information designating the memory 11 is stored, and hence the CPU 14 supplies the memory selection signal MSL having a logic level of 1 to indicate the selection of the memory 11 to the selector 17 and the memory control parts 15 and 16. When program execution memory information designating the memory 12 is stored, the CPU 14 supplies the memory selection signal MSL having a logic level of 0 to indicate the selection of the memory 12 to the selector 17 and the memory control parts 15 and 16. Further, in response to power-on, the CPU 14 supplies a program read signal RP to read out program data to the memory control parts 15 and 16. The CPU 14 executes the program according to the read-out program data PDD supplied via the selector 17, that is, program data read out from the memory 11, thereby realizing the communication mode and the electric power management mode. For example, the CPU 14 adds up the amounts of electric power used in the facility based on the amounts of current CS detected by the current sensor provided in the distribution switchboard and supplies the power usage amount data PWD denoting the resultant amount of electric power to the transmit-receive part 10. Thus, the usage amount of electric power used in the facility is notified to the electric power company. Also, the CPU 14 supplies display data to display a graph or table showing change over time in the amount of electric power used in the facility based on, e.g., the power usage amount data PWD to the display unit 20. Thus, the display unit 20 displays a graph or table showing change over time in the power usage amount. Further, the smart meter 100 performs electric power management control such as reception control of electric power from small-scale power generation facilities such as a solar power generation panel and a wind power generator or charge-discharge control for the battery of an electric car.

When the version upgrade instruction signal VP is supplied from the transmit-receive part 10, the CPU 14 supplies the memory selection signal MSL to select the memory other than the memory designated by the program execution memory information from among the memories 11, 12 and a program write signal WP to the memory control parts 15 and 16.

When the verification enable signal VEN to enable memory write verification is supplied from the verification control part 13, the CPU 14 supplies the memory selection signal MSL having a logic level of 1 to the selector 17 and the memory control parts 15 and 16 and simultaneously supplies a simultaneous enable signal SE to the memory control part 16 and the coincidence determining part 18. Thereafter, the CPU 14 sets itself to be in a disabled state. The disabled state of the CPU 14 is maintained only while the verification enable signal VEN to enable memory write verification is being supplied.

The memory control part 15 goes into an enabled state in response to the memory selection signal MSL having a logic level of 1. At the enabled state, the memory control part 15 supplies the read signal RD1 to the memory 11 in response to the program read signal RP supplied from the CPU 14 or the verification read signal SR supplied from the verification control part 13. Also, at this enabled state, the memory control part 15, in response to the initial program data IPD and program write signal SW supplied from the verification control part 13, supplies this initial program data IPD as program data QD1 to the memory 11 and simultaneously supplies the write signal WR1 to write this to the memory 11. Further, at this enabled state, the memory control part 15 supplies the write signal WR1 to the memory 11 also when the program write signal WP is supplied from the CPU 14. The memory control part 15, in response to the memory selection signal MSL having a logic level of 0, goes into a disabled state to stop the supply of the read signal RD1 and write signal WR1 to the memory 11. The memory control part 15 supplies a coincidence determination validate signal VC having a logic level of 1 to make the determination result through a coincidence determination signal SM, described later, valid to the AND gate 19 only during read operation according to the verification read signal SR.

The memory control part 16 goes into an enabled state in response to the memory selection signal MSL having a logic level of 0. At the enabled state, the memory control part 16 supplies the read signal RD2 to the memory 12 in response to the program read signal RP supplied from the CPU 14 or the verification read signal SR supplied from the verification control part 13. Also, at this enabled state, the memory control part 16, in response to the initial program data IPD and program write signal SW supplied from the verification control part 13, supplies this initial program data IPD as program data QD2 to the memory 12 and simultaneously supplies the write signal WR2 to write this to the memory 12. Further, at this enabled state, the memory control part 16 supplies the write signal WR2 to the memory 12 also when the program write signal WP is supplied from the CPU 14. The memory control part 16 is intrinsically in a disabled state according to the memory selection signal MSL having a logic level of 1, but during this period, when the simultaneous enable signal SE is being supplied from the CPU 14, it is enabled regardless of the level of the memory selection signal MSL.

The selector 17 selects program data according to the memory selection signal MSL from among program data PD1 read out from the memory 11 and program data PD2 read out from the memory 12 to supply as the read-out program data PDD to the verification control part 13 and the CPU 14. For example, when the memory selection signal MSL is at the logic level of 1, the selector 17 supplies the program data PD1 as the read-out program data PDD to the verification control part 13 and the CPU 14. When the memory selection signal MSL is at the logic level of 0, the selector 17 supplies the program data PD2 as the read-out program data PDD to the verification control part 13 and the CPU 14.

The coincidence determining part 18 performs the determination of whether or not the program data PD1 and PD2 coincide with each other as first verification and generates the coincidence determination signal SM, which has a logic level of 1 if the two coincide or a logic level of 0 if not, to supply to the AND gate 19. The AND gate 19 generates a first verification result signal VER, which has a logic level of 1 if the coincidence determination validate signal VC and the coincidence determination signal SM are both at the logic level of 1 or a logic level of 0 otherwise, to output via an external terminal. That is, the AND gate 19 outputs the first verification result signal VER having the logic level of 1, indicating "good", to the outside if the coincidence determination validate signal VC is at the logic level of 1, indicating being execution timing for coincidence determination, and the coincidence determination signal SM denotes that the program data PD1 and PD2 coincide with each other. On the other hand, the AND gate 19 outputs the first verification result signal VER having the logic level of 0, indicating "fail", to the outside if the coincidence determination signal SM denotes that the program data PD1 and PD2 do not coincide with each other, although the coincidence determination validate signal VC is at the logic level of 1, indicating being execution timing for coincidence determination.

The operation of the smart meter 100 will be described below separately for normal operation performed where installed in a facility receiving power supply and for memory write verification operation performed to write the initial version of program data into the memory (11, 12) on the maker side.

[Normal Operation]

First, in response to power-on, the CPU 14 reads out program data stored in the memory 11 and takes in this via the selector 17 to perform control according to the program data. Thus, the smart meter 100 performs the communication mode of operation and the electric power management mode of operation as described above.

When program data for version upgrade and the version upgrade instruction signal are transmitted from the electric power company, the transmit-receive part 10 receives them. The CPU 14 over-writes the received program data for version upgrade into the memory not being currently used for program execution from among the memories 11 and 12. Then, the CPU 14 suspends program execution and reads out the program data from the memory into which the program data for version upgrade has been over-written to execute. If no fault has occurred, the CPU 14 copies the program data for version upgrade into the other memory. By this sequence of processes, automatic program version upgrade finishes.

[Memory Write Verification Operation]

Figure 2:
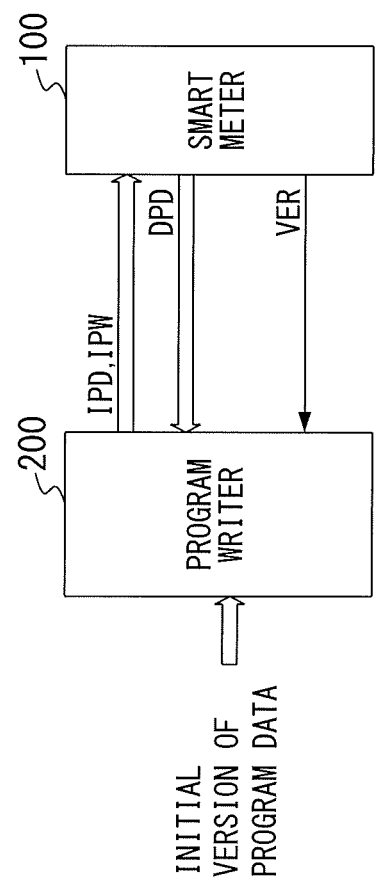
FIG. 2 is a block diagram showing a system configuration when the initial version of program data is written into the smart meter 100.

In preparation for performing the memory write verification operation, a program writer 200 having a verification function is connected to the smart meter 100 as shown in FIG. 2.

Figure 3:
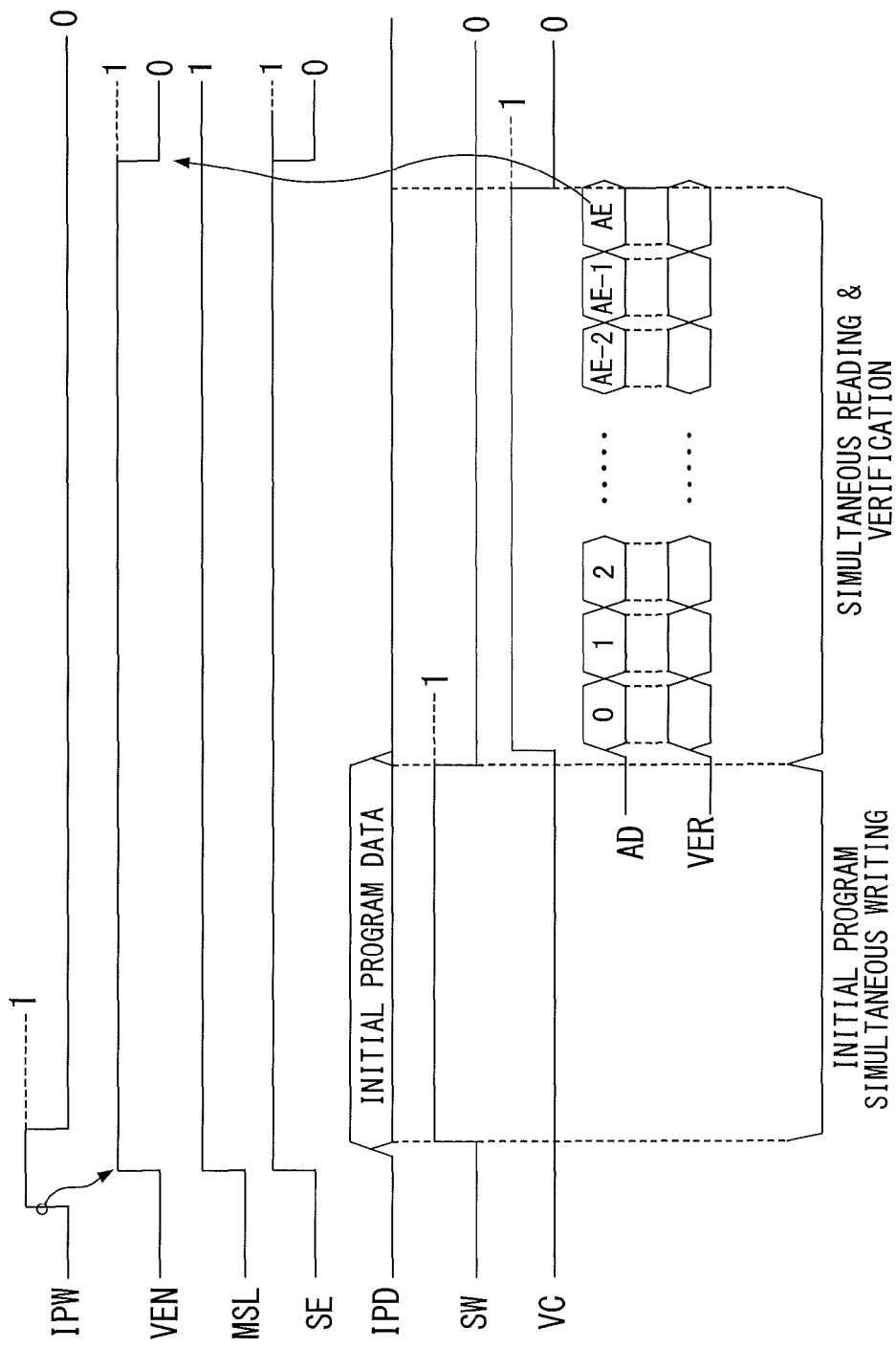
FIG. 3 is a time chart showing internal operation in a memory write verification process.

The program writer 200 supplies the program write instruction signal IPW having the logic level of 1 to instruct to write program data and the initial version of initial program data IPD to the smart meter 100 as shown in FIG. 3. According to the program write instruction signal IPW, the verification control part 13 of the smart meter 100 executes a memory write verification routine as shown in FIG. 4.

Figure 4:
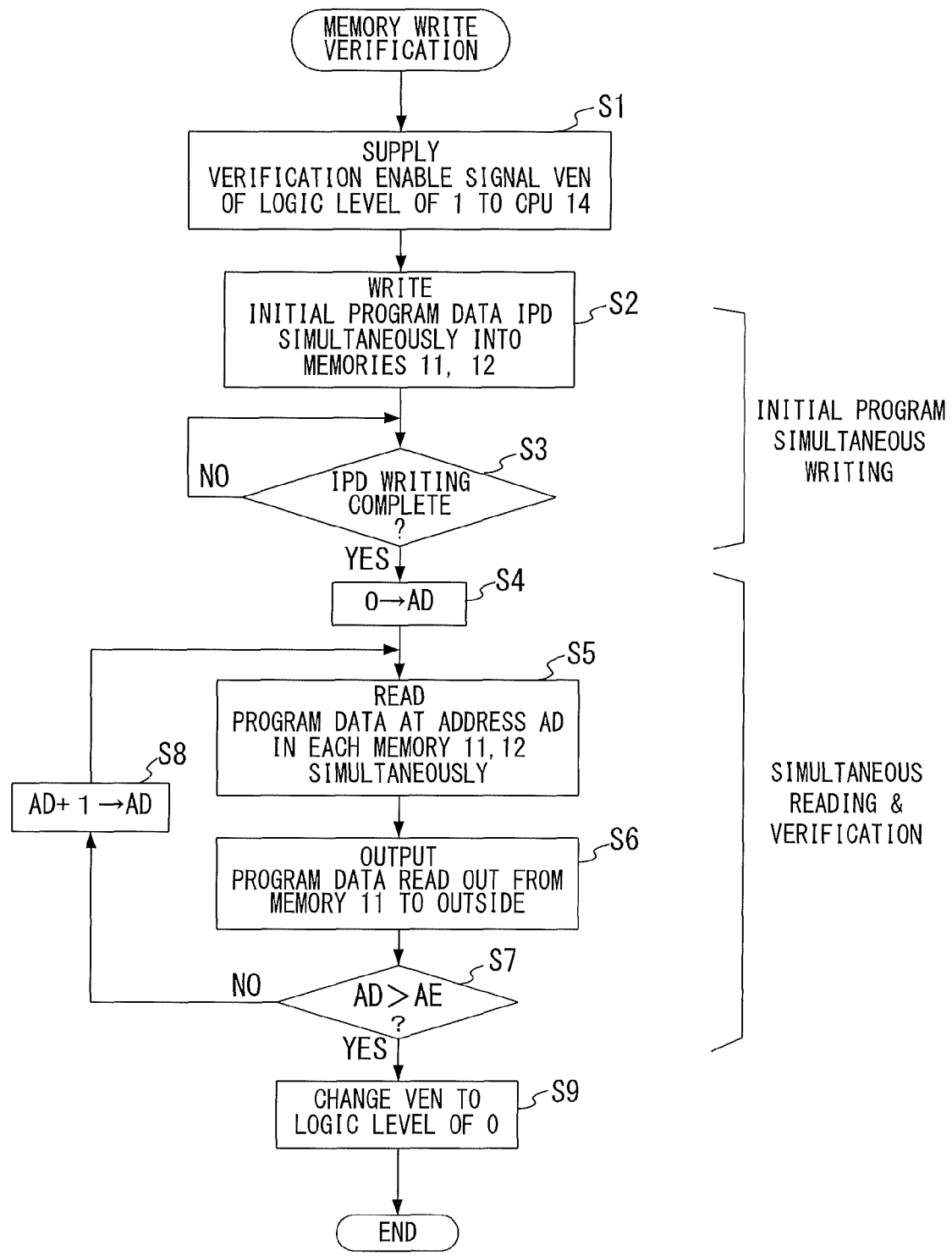
FIG. 4 is a flow chart showing a memory write verification routine.

In FIG. 4, the verification control part 13 supplies the verification enable signal VEN having the logic level of 1 to enable memory write verification as shown in FIG. 3 to the CPU 14 (step S1). Owing to the execution of step S1, the CPU 14 supplies the memory selection signal MSL having the logic level of 1 to the selector 17 and the memory control parts 15 and 16 and simultaneously supplies the simultaneous enable signal SE having the logic level of 1 to instruct to write simultaneously to the memory control part 16 and the coincidence determining part 18 as shown in FIG. 3 and then sets itself to be in a disabled state. Thus, according to the program write instruction signal IPW, the CPU 14 goes into a disabled state, where the CPU 14 stops operating, and the memories 11 and 12 both go into an enabled state, where memory access is possible.

Then, the verification control part 13 supplies the initial version of initial program data IPD supplied from the program writer 200 to the memory control parts 15 and 16 and simultaneously supplies the program write signal SW having the logic level of 1 to instruct to write to the memory control parts 15 and 16 (step S2). Owing to the execution of step S2, the initial program data IPD is written as program data QD1 sequentially into the memory 11 and simultaneously written as program data QD2 sequentially into the memory 12. Thus, the same initial program data is written into each of the memories 11 and 12.

Next, the verification control part 13 repeats the determination of whether all the initial program data IPD has been written into the memories 11 and 12 until it is determined to have been written (step S3). If at the step S3 it is determined that all the initial program data IPD has been written into the memories 11 and 12, the verification control part 13 sets an initial verification read address AD to "0" (step S4).

Then, the verification control part 13 supplies the verification read signal SR to the memory control parts 15 and 16 to read a piece of program data written at the verification read address AD (step S5). Owing to the execution of step S5, the program data PD1 at the verification read address AD is read out from the memory 11, and simultaneously the program data PD2 at the verification read address AD is read out from the memory 12. If it is determined that the program data PD1 and PD2 coincide with each other in the first verification by the coincidence determining part 18, the first verification result signal VER indicating "good" is supplied to the program writer 200. On the other hand, if it is determined that the program data PD1 and PD2 do not coincide with each other, the first verification result signal VER having the logic level of 0, indicating "fail" is supplied to the program writer 200.

Then, the verification control part 13 transmits the program data PD1 read out from the memory 11 via the selector 17 as read-out program data DPD for verification to the program writer 200 (step S6).

The program writer 200 determines whether the initial version of program data supplied to the smart meter 100 and the read-out program data DPD for second verification read out from the memory 11 coincide with each other, that is, performs the second verification to obtain the determining result as a second verification result signal.

The program writer 200 obtains a verification result indicating "good" if the first verification result signal VER supplied from the smart meter 100 owing to the execution of step S5 and the second verification result signal both indicate a coincidence and a verification result indicating "fail" if either or both indicate a non-coincidence.

After the execution of step S6, the verification control part 13 determines whether or not the verification read address AD is greater than the final address AE of the area where the program data is stored (step S7). If at step S7 the verification read address AD is determined to be not greater than the final address AE, the verification control part 13 sets the verification read address AD plus 1 as a new verification read address AD (step S8). After the execution of step S8, returning to the execution of the step S5, the verification control part 13 repeats the above operation.

That is, by repeating the steps S5 to S8, the verification control part 13 reads out program data written at the verification read address AD from the memories 11 and 12 simultaneously while incrementing the verification read address AD by steps of 1 address increment. During this period, the coincidence determining part 18 determines whether pieces of program data read out simultaneously from the memories 11 and 12 coincide for each of the verification read addresses AD and supplies the determining result as the first verification result signal VER to the program writer 200. Further, the verification control part 13 transmits the program data PD1 read out from the memory 11 as the read-out program data DPD for verification to the program writer 200 for each verification read address AD. The program writer 200 determines whether or not the initial version of the program data supplied to the smart meter 100 and the read-out program data DPD for verification read out from the memory 11 coincide for each verification read address AD and obtains the determining result as the second verification result signal. Then, the program writer 200 obtains the verification result indicating "good" only if the first verification result signal VER and the second verification result signal both indicate a coincidence for all the verification read addresses AD. At this time, the program writer 200 determines that it has succeeded in writing the initial version of the program data into the memories 11 and 12 and displays information indicating success in writing. On the other hand, if for at least one verification read address AD either of the first verification result signal VER and the second verification result signal indicates a non-coincidence, or both indicate a non-coincidence, the program writer 200 obtains the verification result indicating "fail". At this time, the program writer 200 determines that it has failed in writing the initial version of the program data into the memories 11 and 12 and displays information indicating failure in writing.

During this period, if at the step S7 the verification read address AD is determined to be greater than the final address AE, the verification control part 13 changes the verification enable signal VEN to the logic level of 0 to disable the memory write verification as shown in FIG. 3 (step S9), thus ending the memory write verification process. According to the verification enable signal VEN having the logic level of 0, the CPU 14 goes into an enabled state to perform control for the communication mode and the electric power management mode.

As described above, at the stage preceding product shipment, in order to have the smart meter 100 take in the initial program data (IPD), first, this initial program data is written simultaneously into the memories 11 and 12 as program memories (S2). After writing the initial program data finishes, the initial program data is read out simultaneously from each of the memories 11 and 12 (S5). During this period, the smart meter 100 performs the first verification, which determines whether or not the respective initial program data read out from both the memories coincide with each other, and outputs the determining result as the verification result signal (VER) to the outside and simultaneously the initial program data (PD1) read out from the memory 11 as the read-out program data (DPD) for the second verification to the outside (S6).

Thus, the program writer 200, with performing the second verification to determine whether or not the read-out program data read out from the memory 11 and the initial program data coincide with each other, can realize whether or not the same program data is written into each of the memories 11 and 12 through the first verification result signal. By this means, essentially at the same time that the verification for program data written into the memory 11 is performed, the verification for program data written into the memory 12 is performed.

Thus, with the information processing device according to the present invention, after program data is written into the two memories, the verification process can be completed at higher speed as compared with the case where after the verification for program data written into one memory, the verification is performed for program data written into the other memory. Therefore, according to the present invention, the same program data can be written into the two memories at high speed and with high reliability.

Although in the above embodiment the same program data is written into the two memories 11 and 12, a configuration may be made where the same program data is written into a plurality of, three or more, memories. That is, a plurality of, three or more, memories are provided in the smart meter 100, and after the same initial program data is written into each of the memories, the verification control part 13 reads out the initial program data from each of the memories simultaneously. At this time, the verification control part 13 outputs one of the respective read-out program data read out from the memories as program data for the second verification, which performs coincidence determination with the initial program data, to the outside. During this period, the coincidence determining part 18 performs the first verification to determine whether or not the respective read-out program data read out from the three or more memories coincide and outputs a verification result signal indicating the determination result to the outside.

Although in the above embodiment the operation of the present invention has been described taking the smart meter 100 as an example of the information processing device, the present invention can also be applied to other information processing devices than smart meters. Although in the above embodiment program data to be executed by the CPU 14 is written into the memories 11 and 12, the type of data to be written into the memories is not limited to program. For example, information data such as voice data, video data, or control parameter data may be written into the memories.

In summary, in the information processing device according to the present invention, after having the same write information data piece (IPD) written into each of the plurality of memories according to the write instruction (IPW), the verification control part (13) reads out information data piece from the plurality of memories. The coincidence determining part (18) performs the first verification to determine whether or not the read-out information data pieces read out from the memories coincide with each other and outputs the verification result signal (VER) to the outside. At the same time, the coincidence determining part (18) outputs one of the read-out information data pieces as the read-out information data piece (DPD) for the second verification, which performs coincidence determination with the write information data piece (IPD), to the outside. Thus, with performing the second verification to determine whether or not the read-out information data piece (DPD) read out from one of the plurality of memories and the write information data piece (IPD) coincide with each other, it can be realized through the first verification result (VER) whether the same program data has been written into all the memories. That is, in the time period during which to read out information data pieces respectively from the memories once, the determination of whether or not the same write information data piece has been written into all the memories (the first verification) and the determination of whether or not the write information data piece has been correctly written (the second verification) are performed in parallel. At this time, it can be determined through the first and second verification results whether or not the write information data piece that needs to be written has been correctly written into all the memories.

According to the present invention, there is provided a verifying method of information data, and the information data verifying method comprises, after having the same write information data piece written into each of a plurality of memories, reading out information data piece simultaneously from each of the plurality of memories; determining whether or not respective read-out information data pieces read out from the memories coincide with each other to obtain the determining result as a first verification result and simultaneously determining whether or not one of the read-out information data pieces and the write information data piece coincide with each other to obtain the determining result as a second verification result; and if the first verification result and the second verification result both indicate a coincidence, determining having succeeded in writing the write information data piece.

Thus, according to the present invention, as compared with the case where reading is performed for each memory and where on each reading occasion it is determined whether or not the information data piece has been correctly written (the second verification), the verification process can be completed at higher speed, and hence the same program data can be written into each of the plurality of memories at high speed and with high reliability.

This application is based on a Japanese Patent application No. 2013-137959 which is hereby incorporated by reference.

What is claimed is:

1. An information processing device which includes a plurality of memories, comprising:
   a verification control part that controls the plurality of memories to write a same write information data piece into each of the plurality of memories according to a write instruction and then to read out information data pieces from the plurality of memories; and
   a coincidence determining part that performs a first verification to determine whether the respective read-out information data pieces read out from the plurality of memories by the verification control part coincide with each other and outputs a verification result signal representing a determination result,
   wherein the verification control part is configured to output one of the read-out information data pieces as an information data piece for memory checking,
   wherein said write information data piece is a program data representing a program, said information processing device further comprising:
   a central processing unit (CPU) that, in response to power-on, reads out the program data from one memory of the plurality of memories and performs a control function according to the program data read out from the one memory; and a receive part that receives program data for a version upgrade and a version upgrade instruction signal, wherein said CPU, in response to the reception of the version upgrade instruction signal, has the program data for version upgrade written into the one memory of the plurality of memories.

2. An information processing device according to claim 1, wherein the verification control part is configured to write the write information data piece simultaneously into each of the plurality of memories and to read out the information data piece simultaneously from each of the plurality of memories.

3. An information processing device according to claim 1, wherein the CPU is set to be in a disabled state in response to the write instruction.

4. A semiconductor device in which a plurality of memories are formed, comprising:

a verification control part that controls the plurality of memories to write a same write information data piece into each of the plurality of memories according to a write instruction and then to read out information data pieces from the plurality of memories; and a coincidence determining part that performs a first verification to determine whether the respective read-out information data pieces read out from the plurality of memories by the verification control part coincide with each other and outputs a verification result signal representing a determination result, wherein the verification control part is configured to output one of the read-out information data pieces as an information data piece for memory checking, wherein said write information data piece is a program data representing a program, said information processing device further comprising:

a central processing unit (CPU) that, in response to power-on, reads out the program data from one memory of the plurality of memories and performs control according to the program data read out from the one memory; and a receive part that receives program data for a version upgrade and a version upgrade instruction signal, wherein said CPU, in response to the reception of the version upgrade instruction signal, has the program data for version upgrade written into the one memory of the plurality of memories.

* * * * *